United States Patent
Ozeki et al.

(10) Patent No.: US 8,004,446 B2
(45) Date of Patent: Aug. 23, 2011

(54) A/D CONVERTER AND A/D CONVERSION METHOD

(75) Inventors: Toshiaki Ozeki, Osaka (JP); Koji Oka, Osaka (JP); Daisuke Nomasaki, Osaka (JP); Ikuo Hidaka, Kyoto (JP); Yoshikazu Makabe, Osaka (JP)

(73) Assignee: Panasonic Corporation, Osaka (JP)

( * ) Notice: Subject to any disclaimer, the term of this patent is extended or adjusted under 35 U.S.C. 154(b) by 61 days.

(21) Appl. No.: 12/529,092

(22) PCT Filed: Feb. 28, 2008

(86) PCT No.: PCT/JP2008/000382
§ 371 (c)(1),
(2), (4) Date: Aug. 28, 2009

(87) PCT Pub. No.: WO2008/105183
PCT Pub. Date: Sep. 4, 2008

(65) Prior Publication Data
US 2010/0117879 A1   May 13, 2010

(30) Foreign Application Priority Data
Feb. 28, 2007 (JP) .............................. 2007-048555

(51) Int. Cl.
*H03M 1/38* (2006.01)
(52) U.S. Cl. ............................ 341/161; 341/155
(58) Field of Classification Search ........... 341/122–172
See application file for complete search history.

(56) References Cited

U.S. PATENT DOCUMENTS
6,166,675 A   12/2000 Bright
7,088,278 B2 *  8/2006 Kurose et al. ............... 341/155
7,190,298 B2 *  3/2007 Mulder ......................... 341/156
7,358,872 B2 *  4/2008 Morzano et al. ............. 341/100
7,372,386 B1 *  5/2008 Maloberti et al. ............ 341/144
7,612,700 B2 * 11/2009 Kawahito et al. ............ 341/161
2005/0219101 A1  10/2005 Kurose et al.

FOREIGN PATENT DOCUMENTS
JP   2000-059219   2/2000
JP   2005-286910   10/2005

OTHER PUBLICATIONS

International Search Report issued May 13, 2008 in International (PCT) Application No. PCT/JP2008/000382, filed Feb. 28, 2008.
Written Opinion of the ISA issued May 13, 2008 in International (PCT) Application No. PCT/JP2008/000382, filed Feb. 28, 2008.
Conroy et al., "*An 8-b 85-MS/s Parallel Pipeline A/D Converter in 1-μm CMOS*", IEEE Journal of Solid-State Circuits, vol. 28, Issue 4, Apr. 1993, pp. 447-454.
Arias et al., "*Low-Power Pipeline ADC for Wireless LANs*", IEEE Journal of Solid-State Circuits, vol. 39, No. 8, Aug. 2004, pp. 1338-1340.

* cited by examiner

*Primary Examiner* — Lam T Mai
(74) *Attorney, Agent, or Firm* — Wenderoth Lind & Ponack, L.L.P.

(57) ABSTRACT

An A/D converter which converts an analog input signal into a digital output signal by performing time-divisional parallel processings on the analog input signal using first and second pipeline type unit A/D converters. The A/D converter sets plural unit A/D converters performing parallel processings according to a system request, such that, when the A/D converter operates with a conversion frequency that is lower than the maximum conversion frequency, the unit A/D converter is halted by a control signal, thereby reducing inter-channel errors among the unit A/D converters to improve the precision of the A/D converter.

16 Claims, 9 Drawing Sheets

A/D CONVERTER AND A/D CONVERSION METHOD

TECHNICAL FIELD

The present invention relates to an A/D converter and an A/D conversion method.

BACKGROUND ART

There is a pipeline A/D converter as an example of a high-speed and high-precision A/D converter. The pipeline A/D converter has a plurality of conversion stages connected in cascade, and the first conversion stage outputs a highest-order digit of a digital output signal while the second and subsequent stages successively perform pipeline operations to output lower-order digits. Each of the conversion stages has a sub A/D converter and a MDAC (Multiplying D/A Converter).

In order to realize speed-up of the pipeline A/D converter, speed-up and high precision of an operational amplifier used for the MDAC in each conversion stage are required. However, in realizing speed-up of the operational amplifier, power consumption is significantly increased, and such speed-up has a limitation, leading to a bottleneck in speed-up of the A/D converter.

In order to realize speed-up of the pipeline A/D converter, Non-Patent Document 1 discloses that a line of cascade-connected conversion stages is regarded as a unit A/D converter, and a plurality of unit A/D converters are arranged in parallel to each other to perform A/D conversions in parallel and time-divisionally, thereby to achieve speed-up.

The operational amplifier in the conversion stage of the pipeline A/D converter is in its active state and its reset state alternately for each half clock period during the conversion processing. Utilizing this effect, Non-Patent Document 2 provides an A/D converter which time-divisionally performs parallel processings by using a plurality of unit A/D converters, in which parallel-arranged conversion stages in adjacent unit A/D converters time-divisionally share an operational amplifier for each half clock, thereby to realize low power consumption.

Non-Patent Document 1: Arias, J; Boccuzzi, V.; Quintanilla, L.; Enriquez, L.; Bisbal, D.; Banu, M.; Barbolla, J., "Low-power pipeline ADC for wireless LANs", IEEE Journal of Solid-State Circuits, Volume 39, Issue 8, August 2004, pp. 1338-1340

Non-Patent Document 2: Conroy, C. S. G; Cline, D. W.; Gray, P. R., "An 8-b 85-MS/s parallel pipeline A/D converter in 1-μm CMOS", IEEE Journal of Solid-State Circuits, Volume 28, Issue 4, April 1993, pp. 447-454

DISCLOSURE OF THE INVENTION

Problems to be Solved by the Invention

As described in Non-Patent Document 1 and Non-Patent Document 2, speed-up of the A/D converter is realized by performing time-divisional parallel proccessings using a plurality of unit A/D converters. However, the use of the plural unit A/D converters causes inter-channel errors of inputs among the plural unit A/D converters, resulting in a degradation of the precision of the A/D converter.

Causes for the inter-channel errors among the unit A/D converters may include the gain errors and offset errors in the operational amplifiers which are individually possessed by the respective unit A/D converters, the capacitance errors in the sampling capacitors in the conversion stages, and the like.

Among these causes, the inter-channel errors which occur among the unit A/D converters due to the operational amplifiers can be eliminated in the configuration where the unit A/D converters time-divisionally share the operational amplifiers as described in Non-Patent Document 2, but the other errors among the unit A/D converters cannot be completely eliminated.

Further, in the system using the A/D converter, the request of the system varies due to such as a change in an input signal, and thereby requested specifications for the conversion frequency and the precision of the A/D converter might vary. In the conventional configuration, even when the conversion frequency is lowered relative to the maximum conversion frequency, the inter-channel errors among the unit A/D converters cannot be reduced.

It is an object of the present invention to provide a highly-precise A/D converter and A/D conversion method by reducing inter-channel errors among unit A/D converters so as to make the unit A/D converters operate with an optimum precision when the conversion frequency of the A/D converter is lowered relative to the maximum conversion frequency in response to a request from the system.

Measures to Solve the Problems

In order to solve the above-described problems, according to Claim 1 of the present invention, there is provided an A/D converter for converting an analog input signal into a digital output signal by using first to n-th (n: integer not less than 2) unit A/D converters which time-divisionally perform parallel processings, wherein each of the first to n-th unit A/D converters has cascade-connected first to m-th (m: integer not less than 2) conversion stages; and unit A/D converters are selected from among the first to n-th unit A/D converters according to an externally inputted control signal which responds to a conversion frequency of the A/D converter, whereby the number of unit A/D converters to be operated is set.

According to Claim 2 of the present invention, there is provided an A/D converter for converting an analog input signal into a digital output signal by using first and second unit A/D converters which time-divisionally perform parallel processings, wherein the first unit A/D converter has cascade-connected first to m-th (m: integer not less than 2) conversion stages for the first unit A/D converter; the second unit A/D converter has cascade-connected first to m-th (m: integer not less than 2) conversion stages for the second unit A/D converter; the respective conversion stages of the first and second unit A/D converters share an operational amplifier which performs operational amplification for either of the conversion stages of the first and second unit A/D converters for each half clock period; and a unit A/D converter is selected from the first and second unit A/D converters according to an externally inputted control signal which responds to a conversion frequency of the A/D converter, whereby the number of unit A/D converters to be operated is set.

According to Claim 3 of the present invention, in the A/D converter defined in Claim 1, each of the first to n-th unit A/D converters has a sample/hold circuit which performs sampling of the analog input signal, in a stage prior to the first conversion stage in each unit A/D converter; and unit A/D converters are selected from among the first to n-th unit A/D converters according to an externally inputted control signal which responds to the conversion frequency of the A/D converter, whereby the number of unit A/D converters to be operated is set.

According to Claim 4 of the present invention, in the A/D converter defined in Claim 2, each of the first and second unit A/D converters has a sample/hold circuit which performs sampling of the analog input signal, in a stage prior to the first conversion stage; the sample/hold circuits in the first and second unit A/D converters share an operational amplifier which performs operational amplification for each of the sample/hold circuits for each half clock period between the sample/hold circuits; and a unit A/D converter is selected from the first and second unit A/D converters according to an externally inputted control signal which responds to the conversion frequency of the A/D converter, whereby the number of unit A/D converters to be operated is set.

According to Claim 5 of the present invention, in the A/D converter defined in Claim 1, at least two unit A/D converters among the first to n-th unit A/D converters share an operational amplifier which performs operational amplification for the conversion stage of either of adjacent two unit A/D converters for each half clock period, said operational amplifier being placed between the conversion stages of the adjacent two unit A/D converters; and unit A/D converters are selected from among the first to n-th unit A/D converters according to a control signal which responds to the conversion frequency of the A/D converter, whereby the number of plural unit A/D converters for performing parallel processings is set.

According to Claim 6 of the present invention, in the A/D converter defined in Claim 3, at least two unit A/D converters among the first to n-th unit A/D converters share operational amplifiers which perform operational amplifications for the sample/hold circuit and the conversion stage of either of adjacent two unit A/D converters for each half clock period, said operational amplifiers being provided between the sample/hold circuits and the conversion stages of the adjacent two unit A/D converters, respectively; and unit A/D converters are selected from among the first to n-th unit A/D converters according to a control signal which responds to the conversion frequency of the A/D converter, whereby the number of plural unit A/D converters for performing parallel processings is set.

According to Claim 7 of the present invention, in the A/D converter defined in Claim 2, each of the conversion stages in the adjacent two unit A/D converters has a first capacitor, and plural switch circuits which are operably connected to a reference voltage that is obtained by A/D converting the inputted analog signal by a sub A/D converter and D/A converting the A/D converted signal by a sub D/A converter; each of the conversion stages in the adjacent two unit A/D converters has switches which are time-divisionally connected to an input terminal of the shared operational amplifier; and in a unit A/D converter which does not perform parallel processing, the respective conversion stages in either of the adjacent unit A/D converters are selected according to an externally inputted control signal which responds to the conversion frequency of the A/D converter so as to turn off the switches which are time-divisionally connected to the input terminal of the operational amplifier, and the switches in the selected conversion stages are turned off.

According to Claim 8 of the present invention, in the A/D converter defined in Claim 4, each of the conversion stages of the adjacent two unit A/D converters has a first capacitor, and plural switch circuits which are operably connected to a reference voltage that is obtained by A/D converting the inputted analog signal by a sub A/D converter and D/A converting the A/D converted signal by a sub D/A converter; the sample/hold circuits and the respective conversion stages in the adjacent two unit A/D converters have switches which are time-divisionally connected to the input terminal of the shared operational amplifier; and in a unit A/D converter which does not perform parallel processing, the sample/hold circuit and the respective conversion stages in either of the adjacent unit A/D converters are selected according to an externally inputted control signal which responds to the conversion frequency of the A/D converter so as to turn off the switches which are time-divisionally connected to the input terminal of the operational amplifier, and the switches in the selected sample/hold circuit and conversion stages are turned off.

According to Claim 9 of the present invention, there is provided an A/D converter for converting an input analog signal into a digital signal by using at least two channels which are time-divisionally operated, and using an operational amplifier which is time-divisionally shared between the two channels, the A/D converter including: a switch connected to an input terminal of the operational amplifier; and switches which are provided between a capacitor that is connected to an end of said switch on the side opposite to the input terminal to the operational amplifier and a reference voltage that is obtained by A/D converting the input analog signal by a sub A/D converter and D/A converting the A/D converted signal by a sub D/A converter.

According to Claim 10 of the present invention, the A/D converter defined in any of Claims 1 to 9 includes a control circuit which outputs a control signal which responds to an externally inputted frequency selection signal that determines an output clock frequency of a PLL circuit, to each of the first to n-th unit A/D converters; and the PLL circuit which receives the externally inputted frequency selection signal, and outputs a conversion clock of the A/D converter to each of the first to n-th unit A/D converters; wherein a plurality of unit A/D converters for performing parallel processings are selected from among the first to n-th unit A/D converters according to a control signal which responds to the frequency selection signal.

According to Claim 11 of the present invention, the A/D converter defined in any of Claims 1 to 9 includes a detection circuit which detects the conversion frequency of the A/D converter, and the detection circuit determines a plurality of unit A/D converters for performing parallel processings from among the first to n-th unit A/D converters according to a control signal which responds to the conversion frequency of the A/D converter.

According to Claim 12 of the present invention, there is provided an A/D conversion method using an A/D converter which converts an analog input signal into a digital output signal by using first to n-th (n: integer not less than 2) unit A/D converters which time-divisionally perform parallel processings, wherein each of the first to n-th unit A/D converters has cascade-connected first to m-th (m: integer not less than 2) conversion stages, and unit A/D converters are selected from among the first to n-th unit A/D converters according to an externally inputted control signal which responds to the conversion frequency of the A/D converter, whereby the number of unit A/D converters to be operated is set.

According to Claim 13 of the present invention, there is provided an A/D conversion method using an A/D converter which converts an analog input signal into a digital output signal by using first and second unit A/D converters which time-divisionally perform parallel processings, wherein the first unit A/D converter has cascade-connected first to m-th (m: integer not less than 2) conversion stages for the first unit A/D converter, the second unit A/D converter has cascade-connected first to m-th (m: integer not less than 2) conversion stages for the second unit A/D converter, the conversion stages of the first and second unit A/D converters share an operational amplifier which performs operational amplification for either of the conversion stages of the first and second unit A/D converters for each half clock period, and a unit A/D converter is selected from the first and second unit A/D converters according to an externally inputted control signal which responds to the conversion frequency of the A/D converter, whereby the number of unit A/D converters to be operated is set.

According to Claim 14 of the present invention, there is provided an A/D conversion method for converting an input analog signal into a digital signal by using at least two channels which are time-divisionally operated, and using an operational amplifier which is time-divisionally shared between the two channels, and the method includes, when a sufficient conversion frequency is obtained by only the operation of either of the two channels, turning off a switch for the unused channel, which is connected to an input terminal to the operational amplifier, and turning off switches which are provided between a capacitor that is connected to an end of said switch on the side opposite to the input terminal to the operational amplifier, and a reference voltage which is obtained by A/D converting the input analog signal by a sub A/D converter and D/A converting the A/D converted signal by a sub D/A converter.

Effects of the Invention

According to the present invention, there is provided an A/D converter for converting an analog input signal into a digital output signal by using first to n-th (n: integer not less than 2) unit A/D converters which time-divisionally perform parallel processings, wherein each of the first to n-th unit A/D converters has cascade-connected first to m-th (m: integer not less than 2) conversion stages, and unit A/D converters are selected from among the first to n-th unit A/D converters according to an externally inputted control signal which responds to a conversion frequency of the A/D converter, whereby the number of unit A/D converters to be operated is set. Therefore, when the conversion frequency with which the A/D converter is operated is lower than the maximum conversion frequency, inter-channel errors among the plural unit A/D converters can be reduced by performing A/D conversion with reducing the number of unit A/D converters performing parallel processings in accordance with the control signal or by performing A/D conversion with one unit A/D converter.

Further, according to the present invention, there is provided an A/D converter for converting an analog input signal into a digital output signal by using first and second unit A/D converters which time-divisionally perform parallel processings, wherein the first unit A/D converter has cascade-connected first to m-th (m: integer not less than 2) conversion stages for the first unit A/D converter, the second unit A/D converter has cascade-connected first to m-th (m: integer not less than 2) conversion stages for the second unit A/D converter, the respective conversion stages of the first and second unit A/D converters share an operational amplifier which performs operational amplification for either of the conversion stages of the first and second unit A/D converters for each half clock period; and a unit A/D converter is selected from the first and second unit A/D converters according to an externally inputted control signal which responds to a conversion frequency of the A/D converter, whereby the number of unit A/D converters to be operated is set. Therefore, even in the case where the A/D converter is configured such that the adjacent unit A/D converters time-divisionally share an operational amplifier, when the conversion frequency of the A/D converter which is required by the system is lower than half of the maximum conversion frequency, inter-channel errors among the unit A/D converters can be reduced by performing A/D conversion with one unit A/D converter.

Further, according to the present invention, each of the first to n-th unit A/D converters has a sample/hold circuit which performs sampling of the analog input signal in a stage prior to the first conversion stage in each unit A/D converter, and unit A/D converters are selected from among the first to n-th unit A/D converters according to an externally inputted control signal which responds to the conversion frequency of the A/D converter, whereby the number of unit A/D converters to be operated is set. Therefore, also when the A/D converter has the sample/hold circuits, the precision of A/D conversion processing can be enhanced by performing A/D conversion with only the first unit A/D converter.

Further, according to the present invention, each of the first and second unit A/D converters has a sample/hold circuit which performs sampling of the analog input signal in a stage prior to the first conversion stage, the sample/hold circuits in the first and second unit A/D converters share an operational amplifier which performs operational amplification for each of the sample/hold circuits for each half clock period between the sample/hold circuits, and a unit A/D converter is selected from the first and second unit A/D converters according to an externally inputted control signal which responds to the conversion frequency of the A/D converter, whereby the number of unit A/D converters to be operated is set. Therefore, the precision of the A/D conversion processing can be enhanced by performing A/D conversion using only the first unit A/D converter according to the control signal which responds to the conversion frequency.

Further, according to the present invention, the A/D converter includes a control circuit which outputs a control signal that responds to an externally inputted frequency selection signal that determines an output clock frequency of a PLL circuit to each of the first to n-th unit A/D converters, and the PLL circuit which receives the externally inputted frequency selection signal, and outputs a conversion clock of the A/D converter to each of the first to n-th unit A/D converters, wherein a plurality of unit A/D converters for performing parallel processings are selected from among the first to n-th unit A/D converters according to a control signal which responds to the frequency selection signal. Therefore, unit A/D converters to be operated in the A/D converter can be selected without the necessity of externally inputting a special signal for determining the frequency of the A/D converter when generating the control signal.

Further, according to the present invention, the A/D converter includes a detection circuit which detects the conversion frequency of the A/D converter, and the detection circuit determines a plurality of unit A/D converters for performing parallel processings from among the first to n-th unit A/D converters according to a control signal which responds to the conversion frequency of the A/D converter. Therefore, an optimum number of parallel processings can be automatically selected in response to a request from the system, thereby providing a highly precise A/D converter.

Figure 1:
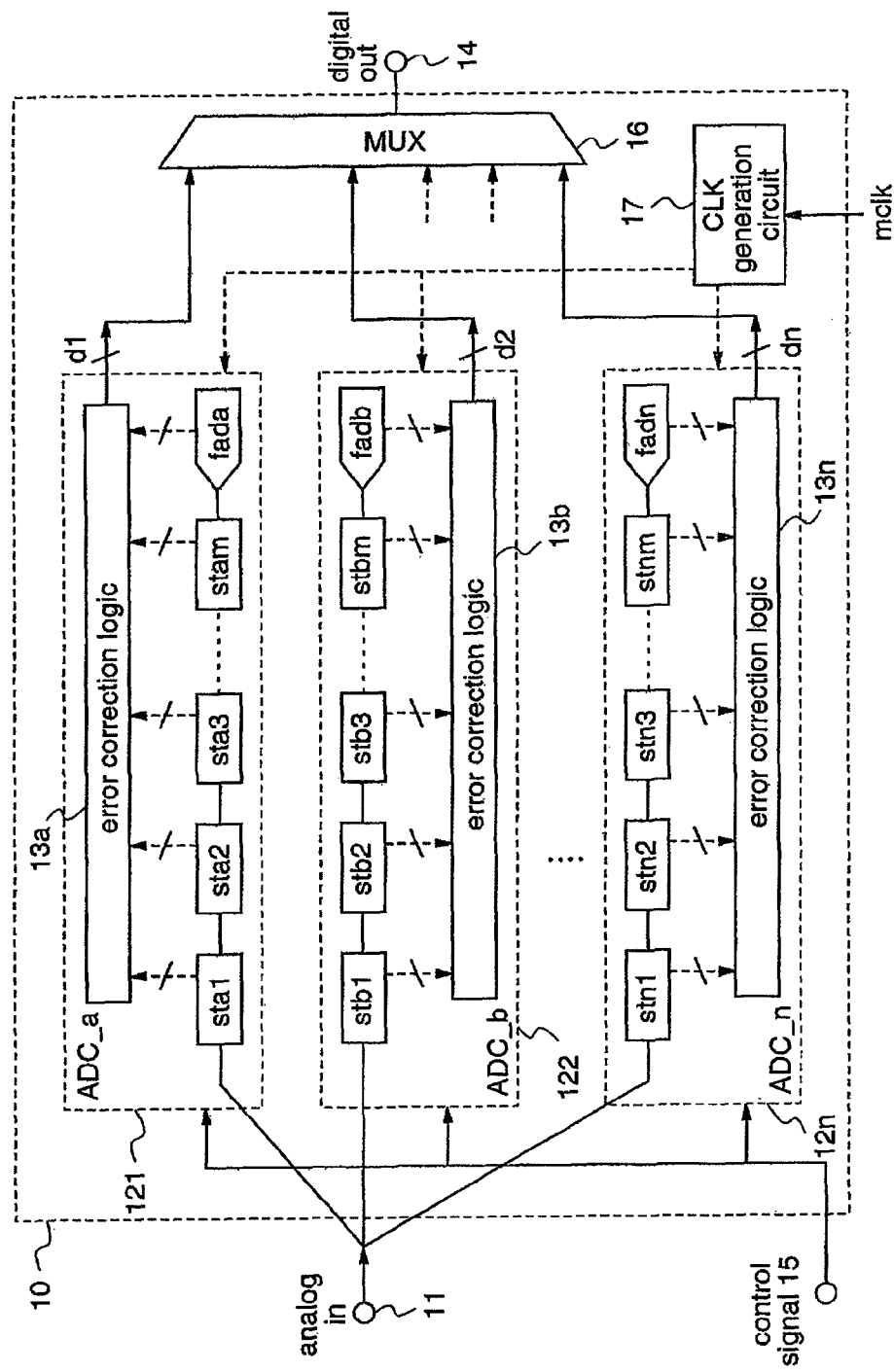
FIG. 1 is a circuit block diagram illustrating an example of an A/D converter according to a first embodiment of the present invention.

DESCRIPTION OF REFERENCE NUMERALS 10,200,300 . . . A/D converter
100 . . . A/D conversion unit
121,122 to 12n . . . unit A/D converter
20,21 . . . conversion stage
sta1 to stan . . . conversion stage
stb1 to stbn . . . conversion stage
stn1 to stnn . . . conversion stage
13a,13b,13n . . . digital correction circuit
fada,fadb,fadn . . . flash A/D converter
16 . . . multiplexer circuit
17 . . . CLK generation circuit
22a,33a . . . sub A/D converter
24a . . . sub D/A converter
26a,32a . . . operational amplifier
C1a,C2a,C1b,C2b,C3 . . . capacitor
sw1a to sw6b . . . switch
amp0 to ampn . . . operational amplifier
34a . . . multiplexer circuit
30 . . . conversion frequency detection circuit
94 . . . PLL circuit
95 . . . control circuit
Z1,Z2 . . . impedance element
Mn1 to Mn3,Mp1,Mp2 . . . transistor

BEST MODE TO EXECUTE THE INVENTION

Hereinafter, embodiments of the present invention will be described with reference to the drawings.

Embodiment 1

FIG. 1 is a diagram illustrating the configuration of an A/D converter according to a first embodiment of the present invention.

With reference to FIG. 1, an analog input signal is inputted to an input terminal 11 of the A/D converter 10, and outputted as a digital output signal from an output terminal 14. The A/D converter 10 is composed of n lines (n: integer not less than 2) of pipeline A/D converters comprising a first unit A/D converter 121, a second unit A/D converter 122 to an n-th unit A/D converter 12n. After the respective unit A/D converters have time-divisionally performed parallel processings, the digital output signals from the respective unit A/D converters are multiplexed by a multiplexer circuit 16 to output a digital output signal. That is, the maximum conversion frequency of the A/D converter 10 is determined by the maximum conversion frequencies of the unit A/D converters and the number of unit A/D converters which perform time-divisional parallel processings.

The first unit A/D converter 121 comprises cascade-connected first to m-th (m: integer not less than 2) conversion stages sta1, sta2 to stam, a flash A/D converter fada which is cascade-connected at a stage subsequent to the conversion stages, and a digital correction circuit 13a.

The second unit A/D converter 122 comprises cascade-connected first to m-th conversion stages stb1, stb2 to stbm, a flash A/D converter fadb which is cascade-connected at a stage subsequent to the conversion stages, and a digital correction circuit 13b.

The n-th unit A/D converter 12n comprises cascade-connected first to m-th conversion stages stn1, stn2 to stnm, a flash A/D converter fadn which is cascade-connected at a stage subsequent to the conversion stages, and a digital correction circuit 13n.

A CLK generation circuit 17 receives a conversion clock mclk for the A/D converter 10 which is externally supplied, and generates conversion clocks clk1, clk2 to clkn for the first to n-th unit A/D converters 121, 122 to 122n.

A control signal 15 is a signal for arbitrarily selecting a unit A/D converter to be operated from among the first, second to n-th unit A/D converters 121, 122 to 12n in accordance with the conversion frequency of the A/D converter 10. Further, the control signal 15 is used also for switching the number of input signals to the multiplexer circuit 16, or for controlling the internal clocks of the A/D converter 10 in some cases.

When it is not necessary for the A/D converter 10 to operate at the maximum conversion frequency depending on a change in the input signal to the A/D converter 10 or a request of the system, it is not necessary to make all the unit A/D converters perform time-divisional processings among the plural unit A/D converters included in the A/D converter 10. Therefore, the number of unit A/D converters for performing time-divisional parallel processings among the plural unit A/D converters included in the A/D converter 10 is determined according to the control signal 15 so as to perform the parallel processings with an optimum number of unit A/D converters. At this time, since the number of the input signals to the multiplexer circuit 16 is varied depending on the number of the unit A/D converters performing parallel processings, the control for the multiplexer circuit 16 must be changed.

Figure 2:
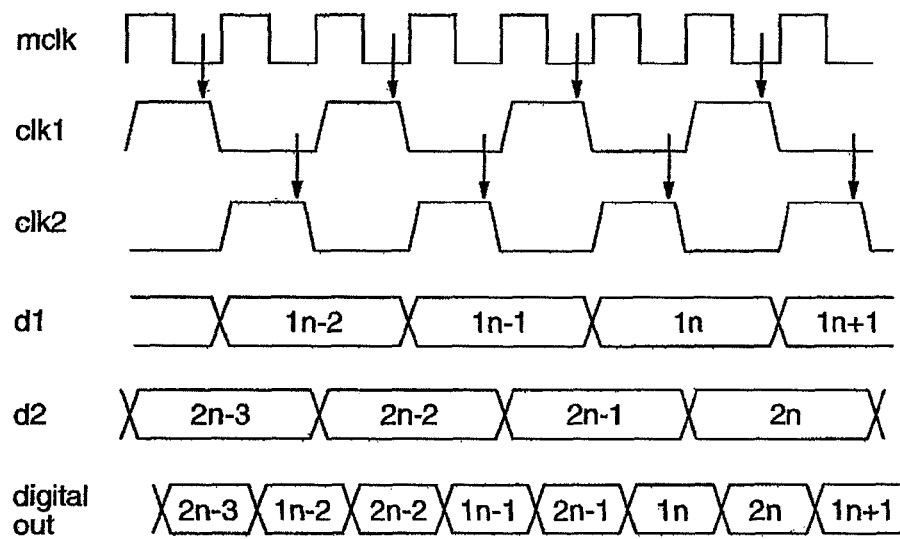
FIG. 2 is a time chart of the A/D converter of the first embodiment.

Next, the operation of the A/D converter 10 will be described with reference to FIG. 2. FIG. 2 shows a timing chart when the time-divisional parallel processings are carried out in the A/D converter 10 with n=2, i.e., with the first unit A/D converter 121 and the second unit A/D converter 122 for simplification. Hereinafter, the operation will be described with n=2. Although the operation will be described with n=2 for simplification, the A/D converter 10 is similarly configured even when n=3 or more.

In FIG. 2, a clock mclk is a conversion clock for the A/D converter 10, a clock clk1 is a conversion clock for the first unit A/D converter 121, and a clock clk2 is a conversion clock for the second unit A/D converter 122. The frequency of the clock mclk is twice the frequency of the clock clk1 (clk2). Further, data d1 denotes a digital output signal from the first unit A/D converter 121, data d2 denotes a digital output signal from the second unit A/D converter 122, and data digital out denotes a digital output signal from the A/D converter 10.

As shown in FIG. 2, the clock clk1 and the clock clk2 have a frequency that is ½ of the clock mck1, the phases thereof are shifted by 180° from each other, and the analog input signal is sampled at the falling edges of the respective clocks. Next, after performing digital conversions by the respective unit A/D converters, the data d1 and the data d2 are outputted at the falling edges of the clock clk1 and the clock clk2, respectively. Next, the data outputted from the first unit A/D converter 121 and the data outputted from the second unit A/D converter 122 are multiplexed by the multiplexer 16 to be output as a digital output signal from the A/D converter 10.

As described above, the first unit A/D converter 121 and the second unit A/D converter 122 time-divisionally perform parallel signal processings, thereby to realize speed-up of the A/D converter. When the plural unit A/D converters perform parallel processings, inter-channel errors occur between the unit A/D converters, and the inter-channel errors may cause characteristic degradation of the A/D converter. The causes for the inter-channel errors include the offset errors and DC gain errors in the operational amplifiers used in the conversion stages, the errors in the sampling capacitors used in the conversion stages, and the like.

In this first embodiment, when the conversion frequency of the A/D converter is half or less than the maximum conversion frequency, the second unit A/D converter 122 is stopped by the control signal 15 so that the first unit A/D converter 121 and the second unit A/D converter 122 do not perform time-divisional parallel processings but only the first unit A/D converter 121 performs A/D conversion.

Figure 3:
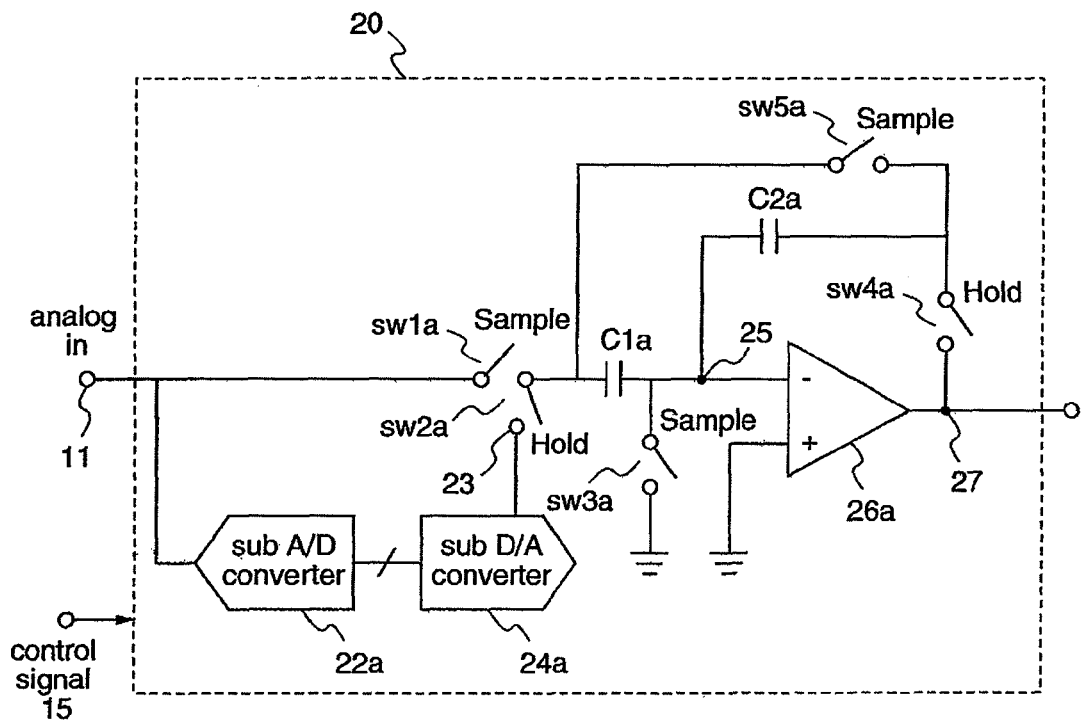
FIG. 3 is a circuit block diagram illustrating a conversion stage in the A/D converter of the first embodiment.

Next, FIG. 3 shows a circuit block diagram of a conversion stage 20. The conversion stage 20 shown in FIG. 3 is any of the first to m-th conversion stages stb1 to stbm, the first to m-th conversion stages stb1 to stbm, and the first to m-th conversion stages stn1 to stnm, which is schematically illustrated as a circuit block. The conversion stage 20 comprises a sub A/D converter 22a, a sub D/A converter 24a, an operational amplifier 26a, a first capacitor C1a, a second capacitor C2a, and five switches sw1a, sw2a, sw3a, sw4a, and sw5a.

In the unit A/D converter not to be operated, at least the switches sw1a to sw5a for sampling of the analog input signal should be continuously turned off by the control signal 15. A reduction in power consumption can be realized by the power-down of the unused unit A/D converter.

Figure 4:
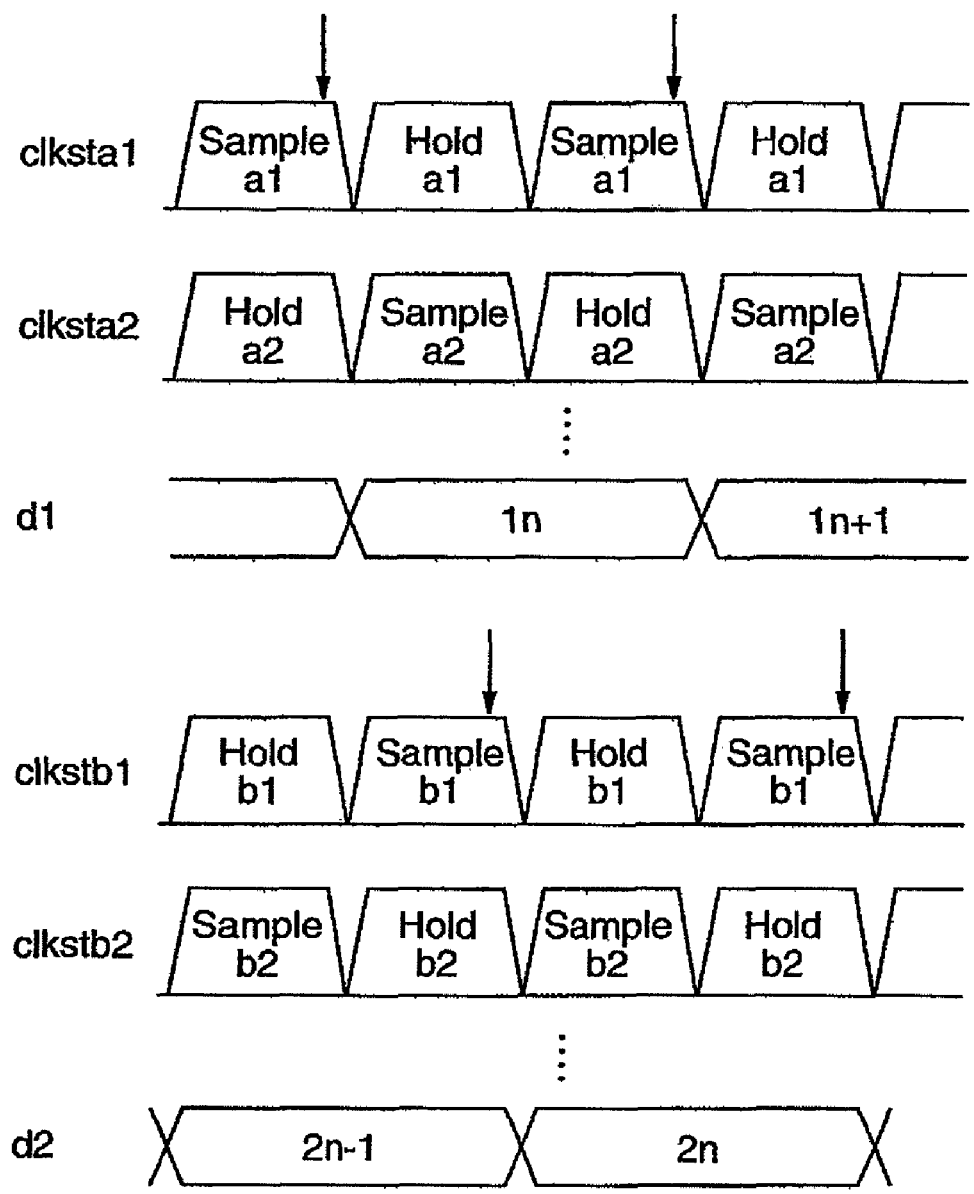
FIG. 4 is a time chart of the conversion stage in the A/D converter of the first embodiment.

Next, FIG. 4 shows the timing chart of each conversion stage in the first (second) unit A/D converter 121 (122). The operation of the conversion stage 20 shown in FIG. 3 will be described with reference to FIG. 4.

As shown in FIG. 4, the operation timing of each conversion stage can be divided into a sampling period "Sample" and an amplification period "Hold". A clock clksta1 indicates the operation of the conversion stage sta1, and a clock clkstb1 indicates the operation of the conversion stage stb1. Further, the switches described as "Sample" and "Hold" in FIG. 3 are turned on in the sampling period "Sample" and the amplification period "Hold", respectively.

First of all, the sampling period "Sample" for sampling the analog input signal will be described. In the sampling period "Sample", since the switches sw1a, sw3a, and sw5a are turned on while the switches sw2a and sw4a are turned off, the analog input signal is applied to the sub A/D converter 22a and to the two capacitors C1a and C2a through the input terminal 11. Further, the switches sw1a, sw3a, and sw5a are turned off upon completion of the sample period "Sample". In order to remove the influence of charge injection which occurs when the switches are turned off, the switch sw3a may be turned off before the sample period "Sample".

Subsequently, in the amplification period "Hold", since the switches sw2a and sw4a are turned on while the switches sw1a, sw3a, and sw5a are turned off, the output terminal 23 of the sub D/A converter 24a is connected to the first capacitor C1a, and the output terminal 27 of the operational amplifier 26a is connected to the second capacitor C2a. At this time, the input terminal 25 of the operational amplifier 26a is virtually grounded. The switches sw2a and sw4a are turned off upon completion of the amplification period "Hold". All the switch operations are carried out in synchronization.

In the sample period "Sample", the analog input signal is applied to the first capacitor C1a and the second capacitor C2a and thereby charges are stored. Simultaneously, the sub A/D converter 22a performs A/D conversion of the analog input signal with a predetermined reference voltage. Subsequently, the data which have been A/D converted by the sub A/D converter 22a are D/A converted by the sub D/A converter 24a, and a reference voltage for performing addition and subtraction in the amplification period "Hold" is determined.

In the amplification period "Hold", the output terminal 23 of the sub D/A converter 24a is connected to the first capacitor C1a, and the output terminal 27 is connected to the second capacitor C2a. At this time, since the input terminal 25 of the operational amplifier 26 is virtually grounded, charges corresponding to the reference voltage of the output from the sub D/A converter 24a are stored in the first capacitor C1a. Accordingly, the remaining charges which are obtained by subtracting the charges existing in the first capacitor C1a, which correspond to the reference voltage of the output of the sub D/A converter 24a, from the charges which have been stored in the first capacitor C1a during the sample period "Sample", are transferred to the second capacitor C2a. In these circuit operations, by setting a capacitor ratio between the first and second capacitors C1a and C2a, addition and subtraction can be carried out with the input voltage being amplified at an arbitrary magnification, and thereby a desired input/output transmission factor can be obtained.

When the first conversion stage sta1 in the initial stage of the first unit A/D converter 121 is operated with the clock clksta1 shown in FIG. 4, the second conversion stage sta2 is operated with a reverse-phase clock like the clock clksta2, and the subsequent third to m-th conversion stages sta3 to stam are similarly operated alternately with the reverse-phase clock. Further, when the first unit A/D converter 121 and the second unit A/D converter 122 perform time-divisional parallel processings, the first conversion stage stb1 in the initial stage of the second unit A/D converter 122 is operated as shown by the clock clkstb1 while the second conversion stage stb2 is operated as shown by the clock clkstb2, and thus the clock clksta1 and the clock clksta2 perform the time-divisional operations with the reverse phases.

In this first embodiment, when the A/D converter 10 is operated in such a manner that the conversion frequency of the A/D converter 10, i.e., the frequency of the clock mclk, is half or less than the maximum conversion frequency of the A/D converter 10, only the first unit A/D converter 121 among the plural unit A/D converters is operated, and thereby the inter-channel errors among the plural unit A/D converters can be reduced as described above, resulting in a highly precise A/D converter.

To be specific, only the first unit A/D converter 121 is operated by turning off at least the switches sw1a, sw4a, and sw5a in all the conversion stages stb1 to stbm in the second unit A/D converter 122 with the control signal 15 according to the conversion frequency. When operating only the first unit A/D converter 121 in this way, the switches in only the first conversion stage stb1 in the second unit A/D converter 122 may be turned off, instead of turning off the switches in all the conversion stages in the second unit A/D converter 122.

As described above, according to the first embodiment, there is provided the A/D converter 10 for converting an analog input signal into a digital output signal by using the first to n-th unit A/D converters 121 to 12n which time-divisionally perform parallel processings, wherein each of the first, to n-th unit A/D converters 121 to 12n has the cascade-connected first to m-th (m: integer not less than 2) conversion stages, and unit A/D converters are selected from among the first to n-th unit A/D converters 121 to 12n according to the externally inputted control signal 15 which responds to the conversion frequency of the A/D converter, whereby the number of unit A/D converters to be operated is set. Therefore, even when the conversion frequency with which the A/D converter is operated is lower than the maximum conversion frequency, inter-channel errors among the plural unit A/D converters can be reduced by performing A/D conversion with reducing the number of unit A/D converters which perform parallel processings in accordance with the control signal, or by performing A/D conversion processing with one unit A/D converter.

Embodiment 2

Figure 5:
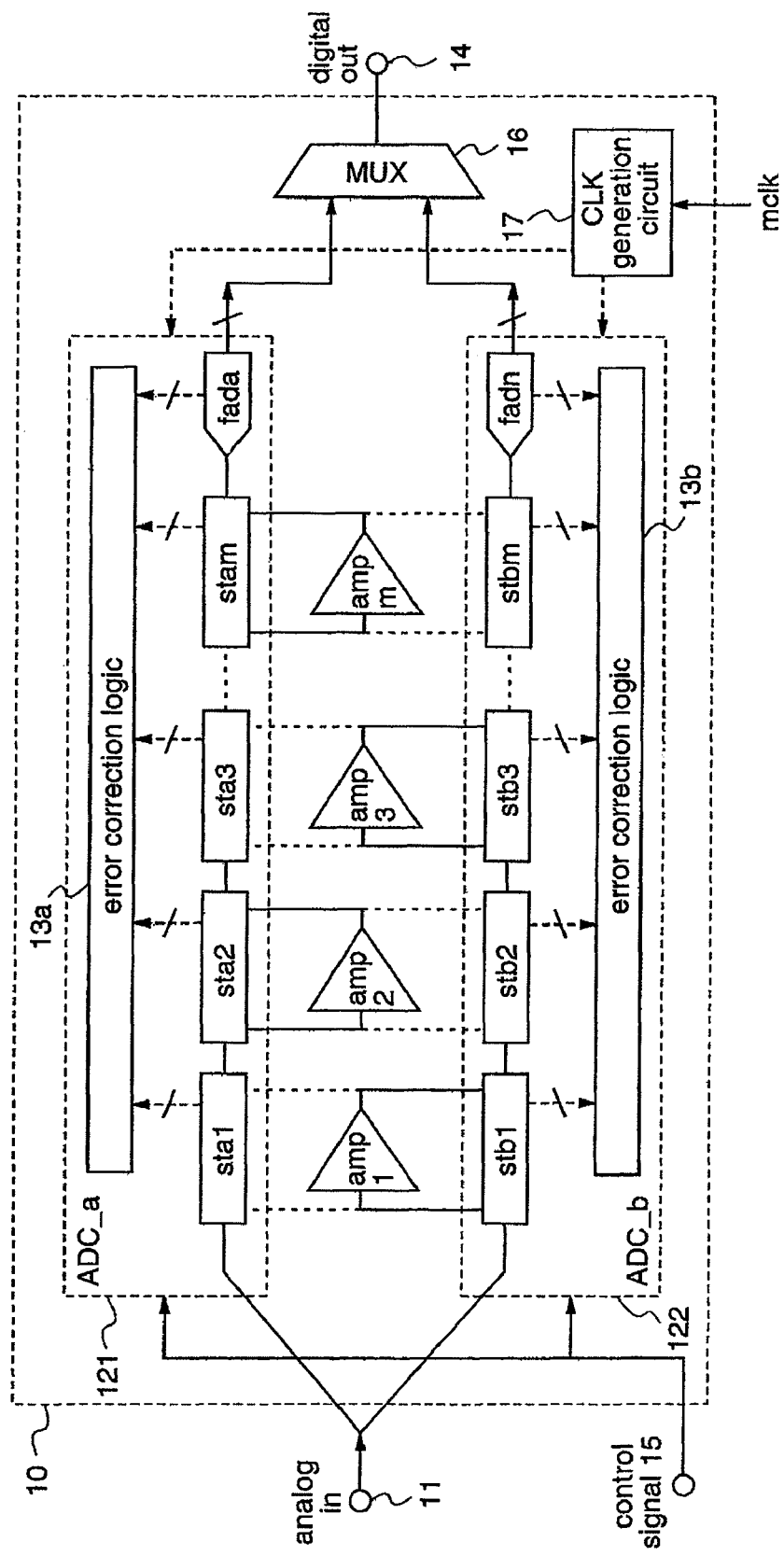
FIG. 5 is a circuit block diagram illustrating an example of an A/D converter according to a second embodiment of the present invention.

An A/D converter according to a second embodiment of the present invention is shown in FIG. 5. The A/D converter 10 shown in FIG. 5 comprises a first unit A/D converter 121, a second unit A/D converter 122, a multiplexer circuit 16, and a CLK generation circuit 17.

In FIG. 5, first, second to m-th (m: integer not less than 2) operational amplifiers amp1, amp2 to ampm correspond to the operational amplifier 26a shown in FIG. 3. The first, second to m-th operational amplifiers amp1, amp2 to ampm are time-divisionally and alternately shared for each half clock between the first, second to m-th conversion stages sta1, sta2 to stam of the first unit A/D converter 121 and the first, second to m-th conversion stages stb1, stb2 to stbm of the second unit A/D converter 122, respectively. While FIG. 5 shows, for simplification, the case where the A/D converter 10 has two lines of unit A/D converters, i.e., the first unit A/D converter 121 and the second unit A/D converter 122, the A/D converter 10 may be configured by n lines of unit A/D converters as in the first embodiment so that the adjacent lines of unit A/D converters can time-divisionally share the operational amplifiers, respectively. For example, when n=5, time-divisional sharing of operational amplifiers may be performed between the lines of the first and second unit A/D converters 121 and 122 and between the lines of the third and fourth unit A/D converters 123 and 124 among the first to fifth unit A/D converters, or time-divisional sharing of operational amplifiers may be performed between the lines of the second and third unit A/D converters 122 and 123 and between the lines of the fourth and fifth unit A/D converters 124 and 125.

As in the operation of the conversion stage 20 of the first embodiment which is described with reference to FIG. 3, since the switches sw1a, sw3a, and sw5a are on while the switches sw2a and sw4a are off during the sample period "Sample", the analog input signal is supplied through the input terminal 11 to the sub A/D converter 22a and to the two capacitors C1a and C2a, and the operational amplifier 26a performs no signal processing. Further, as shown in FIG. 4, since the first conversion stages sta1 and stb1 in the adjacent first and second unit A/D converters 121 and 122 among the parallel-arranged unit A/D converters alternately transit to the amplification period "Hold" for each half clock, the first conversion stages sta1 and stb1 can alternately use the operational amplifier amp1.

Figure 6:
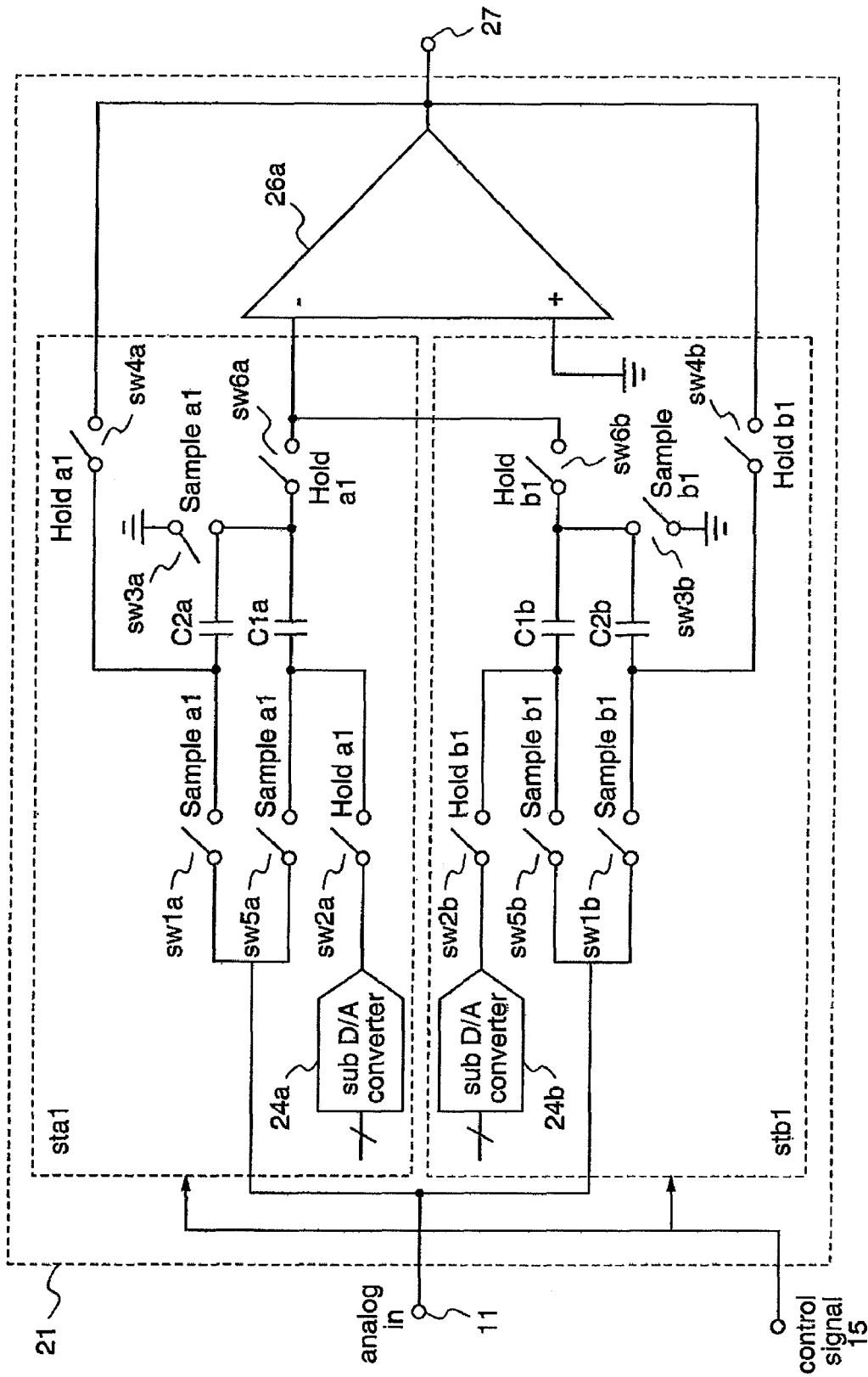
FIG. 6 is a circuit block diagram illustrating an example of a conversion stage in the A/D converter of the second embodiment.

FIG. 6 shows an example of a circuit configuration in the case where the operational amplifier amp1 is shared between the first conversion stage sta1 of the first unit A/D converter 121 and the first conversion stage stb1 of the second unit A/D converter 122. Likewise, the second to m-th operational amplifiers amp2 to ampm may be shared between the second to m-th conversion stages sta2 to stam of the first unit A/D converters 121 and the second to m-th conversion stages stb2 to stbm of the second unit A/D converter 122, respectively. The sub A/D converter is omitted in FIG. 6 for simplification. Further, the switches described as "Sample" and "Hold" in FIG. 6 are turned on during the sample period "Sample" and the amplification period "Hold", respectively, in accordance with the timing chart shown in FIG. 4.

A conversion stage 21 having the shared operational amplifier is configured by the conversion stage sta1 including a first capacitor C1a, a second capacitor C2a, switches sw1a, sw2a, sw3a, sw4a, and sw5a, and a first sub D/A converter 24a, the conversion stage stb1 including a first capacitor C1b, a second capacitor C2b, switches sw1b, sw2b, sw3b, sw4b, and sw5b, and a second sub D/A converter 24b, an operational amplifier 26a, and switches sw6a and sw6b by which the operational amplifier 26a is shared between the conversion stage sta1 and the conversion stage stb1. Further, the switches sw1a to sw5a in the conversion stage sta1 constitute a switch circuit which is connected to the first capacitor C1a and to the reference voltage of the first sub D/A converter 24a, and the switches sw1b to sw5b in the conversion stage stb1 constitute a switch circuit which is connected to the first capacitor C1b and to the reference voltage of the second sub D/A converter 24b. It is also possible to add a switch for resetting the input terminal of the operational amplifier.

The operation of the conversion stage 21 can also be shown by the timing chart of FIG. 4 like the conversion stage 20 of the first embodiment shown in FIG. 3. The sample period "Sample" a1 of the conversion stage sta1 of the first unit A/D converter 121 is equal to the amplification period "Hold" b1 of the conversion stage stb1 of the second unit A/D converter 122, and the same holds for the reverse phase. During the sample period "Sample" a1, i.e., the hold period "Hold" b1, the switches sw1a, sw3a, sw5a and the switches sw2b, sw4b, sw6b are on. Conversely, during the hold period "Hold" a1, i.e., the sample period "Sample" b1, the switches sw2, sw4a, sw6a and the switches sw1b, sw3b, sw5b are on. In this way, when the switch sw6a is turned on in the amplification period "Hold" a1, the input terminal of the operational amplifier 26a is connected to the capacitor in the conversion stage sta1, and when the switch sw6b is turned on in the amplification period "Hold" b1, the input terminal of the operational amplifier 26a is connected to the capacitor in the conversion stage stb1, whereby the conversion stages can be operated with the operational amplifier 26a being shared.

By performing a switch control with a control signal 15 such that at least the switch sw6b or at least the switches sw1b, sw5b, and sw6b in the first conversion stage stb1 of the second unit A/D converter 122 is/are turned off, operational amplification can be performed by only the conversion stages sta1 to stam of the first unit A/D converter 121. At this time, by performing a switch control such that only the switch sw6b or the switches sw1b, sw5b, and sw6b are turned off in all the conversion stages stb1 to stbm of the second unit A/D converter 122, A/D conversion can be performed by only the first unit A/D converter 121. Further, when operating only the first unit A/D converter 121, the switch sw6a in the first conversion stage sta1 of the first unit A/D converter 121 may be simultaneously controlled to be continuously on, and thereby stable operation can be carried out with reducing noises due to on and off of the switch sw6 at the input terminal of the operational amplifier. At this time, the switch sw6a may be controlled so as to be continuously on also in the second to m-th conversion stages sta2 to stam of the first unit A/D converter 121, and thereby the second conversion stage sta2 and the subsequent stages can be similarly operated with stability.

Further, in FIG. 6, when the channel of the second unit A/D converter 122 is not used, the switch sw6b which is connected to the input terminal of the operational amplifier 26a may be turned off, and the switch sw2b which is placed between the first capacitor C1b connected to the switch sw6b and the reference voltage for the channel of the unused second unit A/D converter 122 may be turned off.

While in this second embodiment the adjacent unit A/D converters time-divisionally share the operational amplifier, it may be configured such that, among the first to n-th unit A/D converters 121 to 12n, some unit A/D converts may time-divisionally share the operational amplifier with the adjacent unit A/D converter while the other unit A/D converters do not share the operational amplifier with the adjacent unit A/D converter.

As described above, according to the second embodiment, there is provided the A/D converter 10 for converting an analog input signal into a digital output signal by using the first and second unit A/D converters 121 and 122 which time-divisionally perform parallel processings, wherein the first unit A/D converter 121 has cascade-connected first to m-th (m: integer not less than 2) conversion stages for the first unit A/D converter, the second unit A/D converter 122 has cascade-connected first to m-th (m: integer not less than 2) conversion stages for the second unit A/D converter, the respective conversion stages of the first and second unit A/D converters share an operational amplifier which performs operational amplification for either of the conversion stages of the first and second unit A/D converter for each half clock period, and a unit A/D converter is selected from the first and second unit A/D converters according to the externally inputted control signal which responds to the conversion frequency of the A/D converter, whereby the number of unit A/D converters to be operated is set. Therefore, in the case where the A/D converter is configured such that the adjacent unit A/D converters time-divisionally share an operational amplifier, when the conversion frequency of the A/D converter is lower than half of the maximum conversion frequency, inter-channel errors among the unit A/D converters can be reduced by performing A/D conversion processing with one unit A/D converter.

Embodiment 3

The A/D converter of the first embodiment comprises n lines of unit A/D converters, i.e., the first to n-th unit A/D converters 121 to 12n, and it is configured such that, in the cascade-connected conversion stages in the first to n-th unit A/D converters 121 to 12n, A/D conversion is started at the initial conversion stage sta1 and successively carried out.

Figure 7:
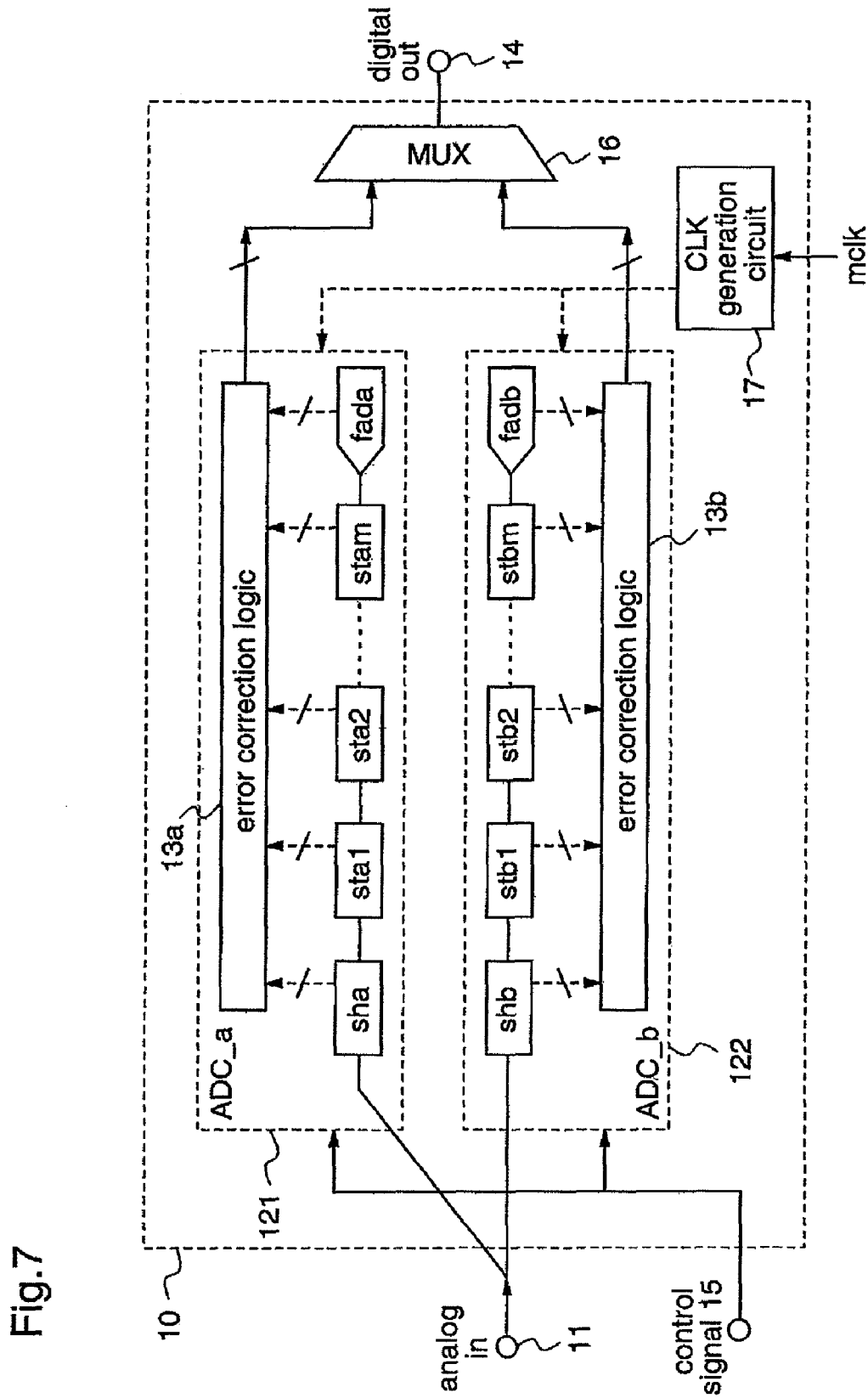
FIG. 7 is a circuit block diagram illustrating an example of an A/D converter according to a third embodiment of the present invention.

As shown in FIG. 7, in an A/D converter of this third embodiment, when an analog input signal has a high frequency, sample/hold circuits sha and shb are placed in the initial stages of the cascade-connected conversion stages in the unit A/D converters, thereby enabling time-divisional parallel processings. While in FIG. 7 the A/D converter 10 is configured by the first and second unit A/D converters 121 and 122 for simplification, the A/D converter 10 can be similarly configured even when the number of unit A/D converters is three or more.

Since inter-channel errors also occur in the sample/hold circuits sha and shb as in the conversion stages, the characteristics thereof might be degraded when performing parallel processings. So, in the A/D converter of this third embodiment, as in the first embodiment, A/D conversion is performed by only the first unit A/D converter 121 among the plural unit A/D converters according to the control signal 15 which responds to the conversion frequency of the A/D converter, whereby the precision of performance of the A/D converter can be enhanced.

As described above, according to the third embodiment, the first to second unit A/D converters 121 and 122 have the sample/hold circuits sha and shb for sampling the analog input signal in the stages prior to the conversion stages sta1 and stb1, respectively, and a unit A/D converter is selected from the first and second unit A/D converters according to the externally inputted control signal 15 which responds to the conversion frequency of the A/D converter 10, whereby the number of unit A/D converters to be operated is set. Therefore, in the case where the A/D converter 10 has the sample/hold circuits sha and shb, the precision of A/D conversion processing can be enhanced by performing A/D conversion using only the first unit A/D converter 121.

Embodiment 4

The A/D converter of the second embodiment comprises the first unit A/D converter 121 and the second unit A/D converter 122, and it is configured such that, in the cascade-connected conversion stages in the first and second unit A/D converters 121 and 122, the conversion stage sta1 is placed in the initial stage, and A/D conversion is successively carried out.

Figure 8:
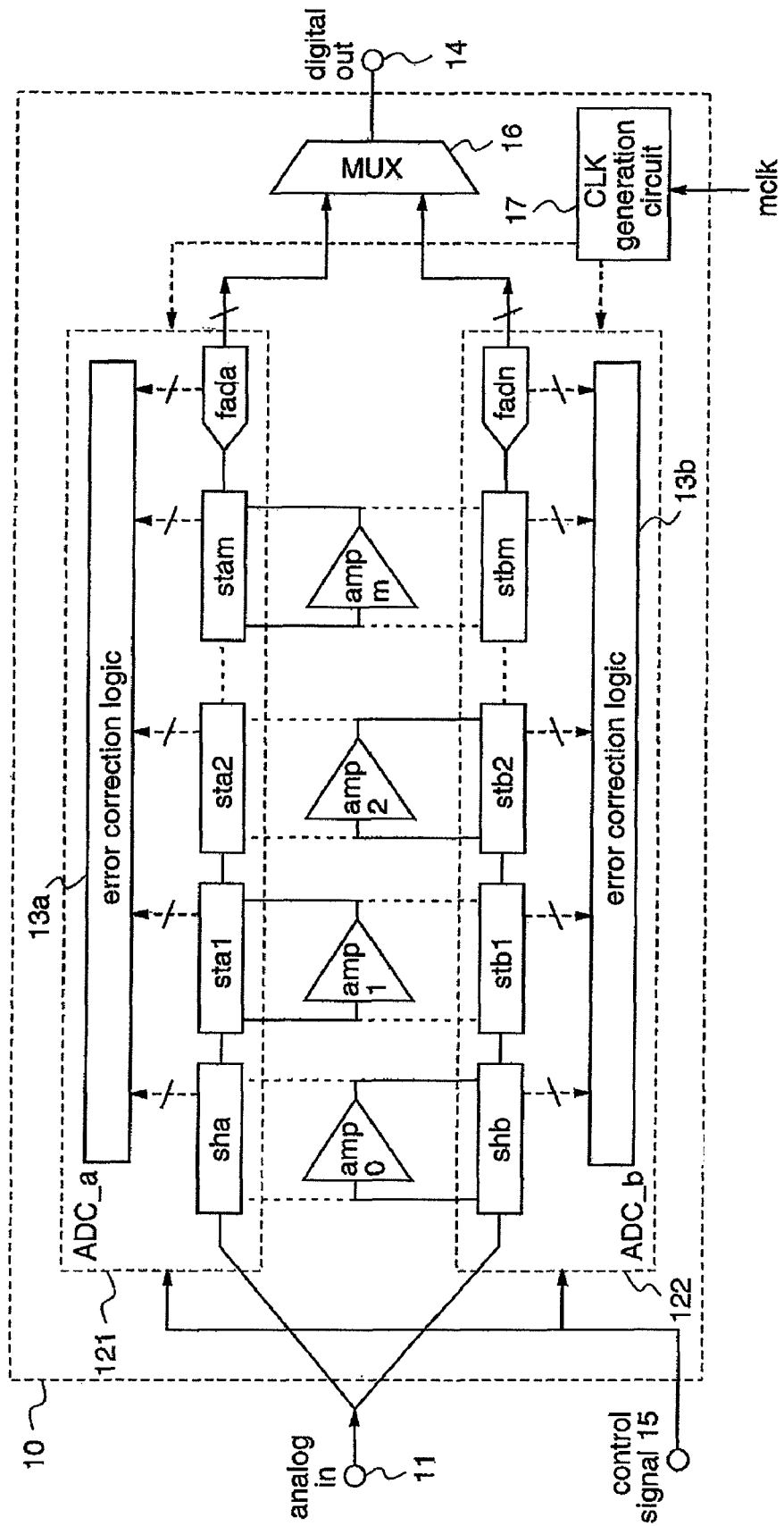
FIG. 8 is a circuit block diagram illustrating an example of an A/D converter according to a fourth embodiment of the present invention.

As shown in FIG. 8, in an A/D converter of this fourth embodiment, as in the third embodiment, first and second sample/hold circuits sha and shb for sampling an analog input signal are placed at the initial stages of the cascade-connected conversion stages in the first and second unit A/D converters 121 and 122. First to n-th operational amplifiers amp1, amp2, amp3 to ampm are time-divisionally and alternately shared for each half clock between the first to m-th conversion stages sta1 to stam in the first unit A/D converter 121 and the first to m-th conversion stages stab1 to stbm in the second unit A/D converter 122, respectively. Likewise, also the first and second sample/hold circuits sha and shb can time-divisionally share an operation amplifier amp0.

In the A/D converter of this fourth embodiment, as in the second embodiment, A/D conversion is carried out by only the first unit A/D converter 121 according to the control signal 15 which responds to the conversion frequency, and thereby the precision of A/D conversion processing can be enhanced.

As described above, according to the fourth embodiment, the first and second unit A/D converters 121 and 122 have the sample/hold circuits sha and shb for sampling the analog input signal at the stages prior to the conversion stages sta1 and stb1, respectively, and the sample/hold circuits sha and shb in the first and second unit A/D converters 121 and 122 share the operational amplifier amp0 which performs operational amplification for each of the sample/hold circuits for each half clock period between the sample/hold circuits, and a unit A/D converter is selected from the first and second unit A/D converters according to the externally inputted control signal 15 which responds to the conversion frequency of the A/D converter 10, whereby the number of unit A/D converters to be operated is set. Therefore, the precision of A/D conversion processing can be enhanced by performing A/D conversion using only the first unit A/D converter 121 in accordance with the control signal 15 which responds to the conversion frequency.

Embodiment 5

The first to fourth embodiments are configured such that the control signal 15 for selecting the number of unit A/D converters which perform parallel processings is supplied from the outside of the A/D converter.

In this fifth embodiment, in a system having a PLL circuit which generates clocks to be supplied to an A/D converter, a control signal to be supplied to the A/D converter is generated using a signal which determines an output clock frequency of the PLL.

Figure 9:
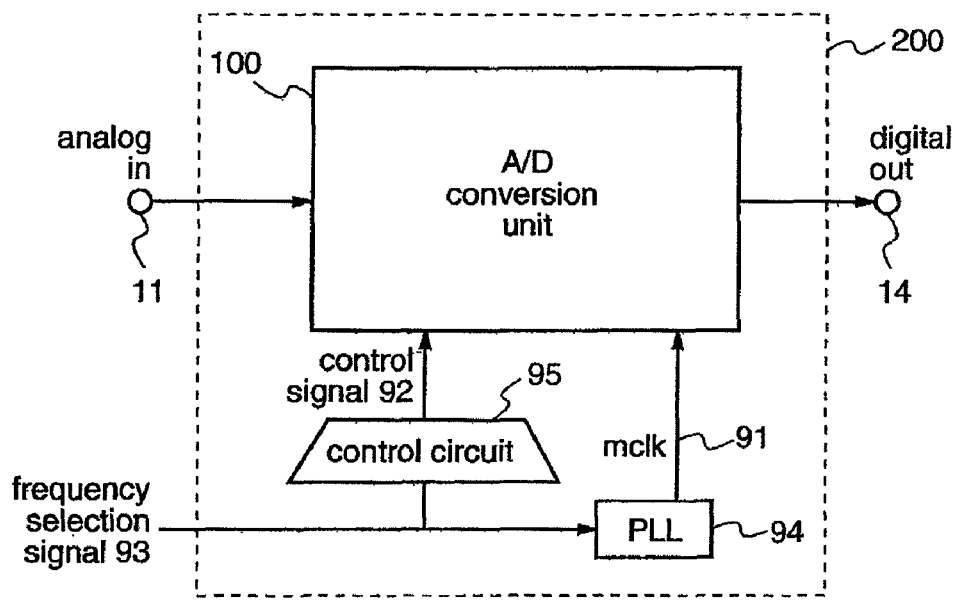
FIG. 9 is a circuit block diagram illustrating an example of an A/D converter according to a fifth embodiment of the present invention.

FIG. 9 is a circuit block diagram of an A/D converter according to the fifth embodiment.

With reference to FIG. 9, the A/D converter 200 comprises an A/D conversion unit 100, a PLL circuit 94, and a control circuit 95. The A/D conversion unit 100 has the same configuration as the A/D converter 10 of the first embodiment. The frequency of the output signal clock mclk of the PLL circuit 94 is determined by a frequency selection signal 93, and the output signal clock mclk is input to the A/D converter unit 100 as a conversion clock mclk 91. Further, the control circuit 95 receives the frequency selection signal 93, and generates a control signal 92 for selecting the number of unit A/D converters performing parallel processings to output the same to the A/D conversion unit 100.

In the A/D converter of the fifth embodiment, the frequency selection signal 93 for frequency switching, which is input to the PLL circuit 94 supplying the clock mclk of the A/D conversion unit, is input to the control circuit 95, and the control circuit 95 generates the control signal using the frequency selection signal 93. Thereby, unit A/D converters to be operated in the A/D converter 10 can be selected without the necessity of externally inputting a special signal for determining the frequency of the A/D converter when generating the control signal.

As described above, the A/D converter of this fifth embodiment includes the control circuit 95 which receives the frequency selection signal 93 for determining the output clock frequency of the PLL circuit from the outside, and outputs the control signal 92 to each of the first to n-th unit A/D converters 121 to 12*n*, and the PLL circuit 94 which receives the frequency selection signal 93 for determining the output clock frequency of the PLL circuit 94 from the outside, and outputs the conversion clock of the A/D converter to each of the first to n-th unit A/D converters 121 to 12*n*, and unit A/D converters for performing parallel processings are selected from among the first to n-th unit A/D converters 121 to 12*n* according to the control signal which is generated in response to the frequency selection signal that determines the frequency of the PLL circuit. Therefore, unit A/D converters to be operated in the A/D converter 10 can be selected without the necessity of externally inputting a special signal for determining the frequency of the A/D converter when generating a control signal.

Embodiment 6

The above-described embodiments 1 and 5 are configured such that the control signal 15 for selecting the number of unit A/D converters to be operated is supplied from the outside of the A/D converter.

In an A/D converter according to this sixth embodiment, the number of unit A/D converters is selected by automatically detecting the conversion frequency.

Figure 10:
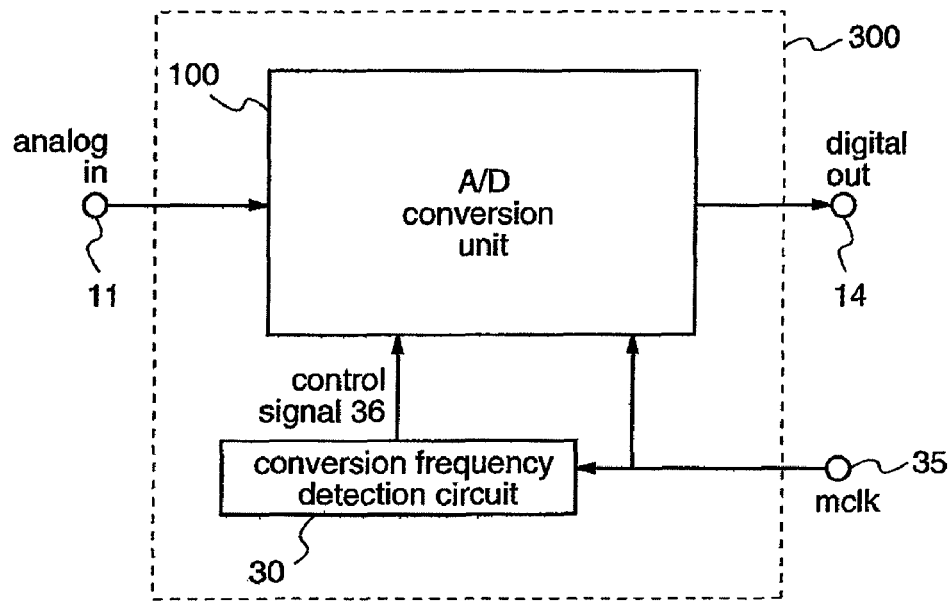
FIG. 10 is a circuit block diagram illustrating an example of an A/D converter according to a sixth embodiment of the present invention.

FIG. 10 is a diagram illustrating the configuration of the A/D converter according to the sixth embodiment.

With reference to FIG. 10, the A/D converter 300 comprises an A/D conversion unit 100, and a conversion frequency detection circuit 30. The A/D conversion unit 100 has the same configuration as the A/D converter 10 of the first embodiment.

As in the first embodiment, the analog input signal is applied to an input terminal 11 of the A/D conversion unit 100, and outputted from an output terminal 14 as a digital output signal. A conversion clock mclk for the A/D conversion unit 100 is input to the A/D conversion unit 10 and to the conversion frequency detection circuit 30. In the conversion frequency detection circuit 30, the frequency of the conversion clock mclk is detected to generate a control signal 36. Like the above-described control signal 15, the control signal 36 is a signal for selecting unit A/D converters to be operated in the A/D conversion unit 100.

Figure 11:
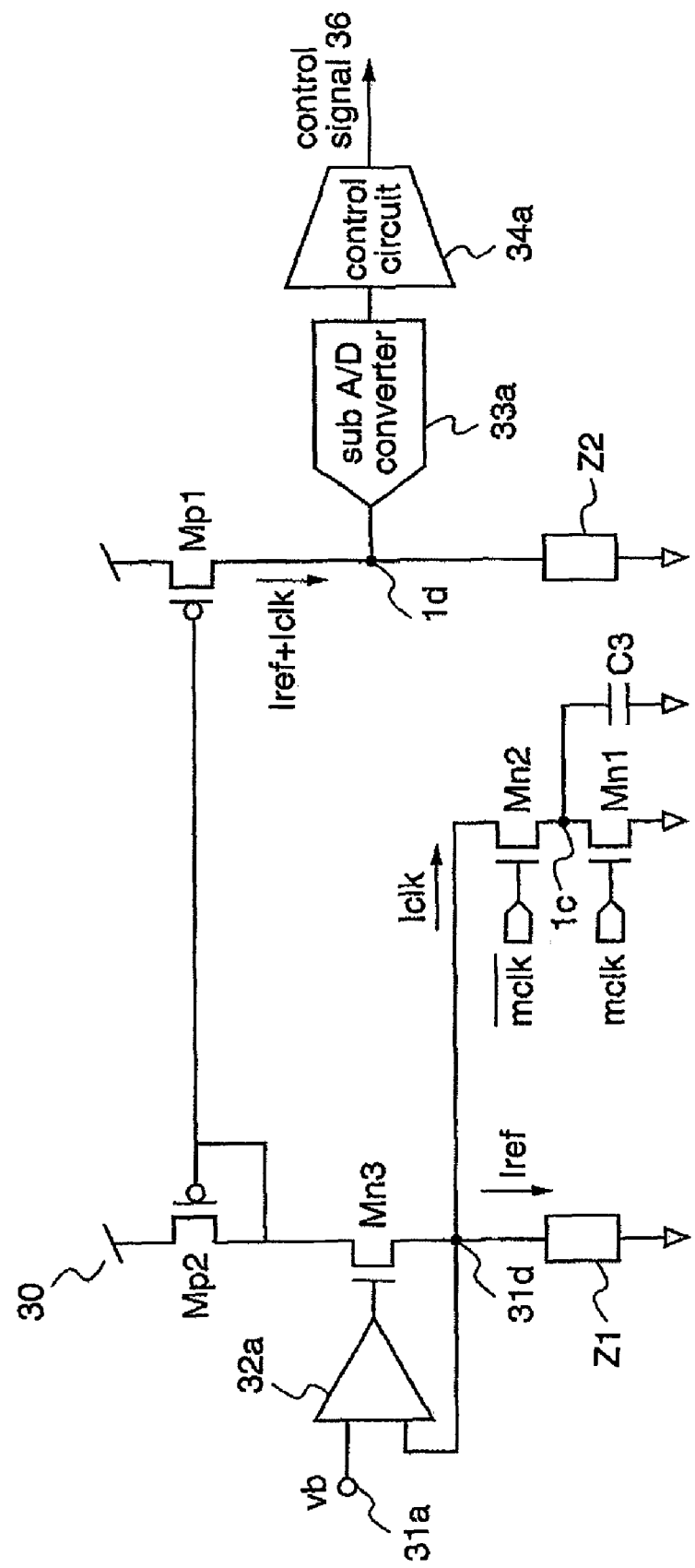
FIG. 11 is a circuit diagram illustrating an example of a conversion frequency detection circuit in the A/D converter of the sixth embodiment.

FIG. 11 shows the detail of the conversion frequency detection circuit 30 shown in FIG. 10. In FIG. 11, the conversion frequency detection circuit 30 comprises n type transistors Mn1, Mn2, and Mn3, p type transistors Mp1 and Mp2, impedance elements Z1 and Z2, a capacitor C3, an operational amplifier 32*a*, a sub A/D converter 33*a*, and a control circuit 34*a*. Usually, such as a monocrystalline silicon resistor or a polycrystalline silicon resistor is adopted as the impedance elements.

A reference voltage vb is applied to the input terminal 31*a*, and the voltage at the terminal 31*b* and the reference voltage vb are virtually grounded by the operational amplifier 32*a* and the transistor Mn3. A constant current Iref having an impedance of "voltage at terminal 31*b*/impedance of impedance element Z1" is supplied to the impedance element Z1.

The clock mclk and its inverse clock are applied to the gate terminals of the transistors Mn1 and Mn2, respectively. When the transistor Mn1 is on, the voltage at the terminal 31*c* is reset. When the transistor Mn2 is on, a current Iclk is supplied to the capacitor C3, and the voltage at the terminal 31*c* becomes equal to the voltage at the terminal 31*b*. The average value of the current Iclk is increased in proportion to the frequency of the clock mclk.

The current supplied to the transistors Mn3 and Mp2 is the sum of the currents Iref and Iclk. A current obtained by mirroring the current Iref+Iclk that flows to the transistor Mp2 is supplied to the transistor Mp1. When the sizes of the transistors Mp1 and Mp2 are made equal, approximately the same current Iref+Iclk is supplied to the both transistors.

The current Iref+Iclk is supplied to the impedance element Z2, and the voltage at the terminal 31*d* becomes a voltage which is obtained by "impedance of impedance element Z2×current Iref+Iclk". That is, since the current Iclk is obtained in proportion to the frequency of the clock mclk, the voltage value at the terminal 31*d* similarly depends on the frequency.

The voltage level at the terminal 31*d* which is in proportion to the frequency of the clock mclk is A/D converted by the sub A/D converter 33*a*, and a control signal 36 is generated in the control circuit 34*a*.

Hereinafter, the A/D converter 10 shown in FIG. 8 of the fourth embodiment will be described.

In the configuration of the A/D converter 10 of this fourth embodiment, the A/D conversion unit 100 comprises the first and second unit A/D converters 121 and 122. Therefore, the sub A/D converter 33$a$ in the conversion frequency detection circuit 30 in the A/D converter 300 of this sixth embodiment has only to judge the frequency of the clock mclk when the frequency is half of the maximum conversion frequency, with a resolution of 1 bit. When the frequency of the clock mclk becomes equal to or lower than half of the maximum conversion frequency, the control circuit 34$a$ outputs a control signal 36 which stops the second unit A/D converter 122.

As described above, according to the sixth embodiment, the A/D converter includes the conversion frequency detection circuit 30 which detects the conversion frequency of the A/D converter according to the clock mclk, and the conversion frequency detection circuit 30 selects plural unit A/D converters for performing parallel processings from among the first to n-th unit A/D converters 121 to 12$n$ according to the control signal 36 that is generated in response to the conversion frequency with which the A/D converter performs conversion processing. Therefore, an optimum number of parallel processings in regard to the precision of A/D conversion processing can be automatically selected for the conversion frequency of the A/D converter which is required from the system, thereby providing a highly precise A/D converter.

APPLICABILITY IN INDUSTRY

An A/D converter and A/D conversion method according to the present invention can operate a pipeline A/D converter with optimum precision and power consumption in response to its operating speed, and are useful in performing processing to which the pipeline A/D converter is applied, such as image signal processing for television or video or communication signal processing for such as wireless LAN, at high speed, low power consumption, and low cost.

The invention claimed is:

1. An A/D converter for converting an analog input signal into a digital output signal by using first to n-th (n: integer not less than 2) unit A/D converters which time-divisionally perform parallel processings, wherein
   each of the first to n-th unit A/D converters has cascade-connected first to m-th (m: integer not less than 2) conversion stages; and
   unit A/D converters are selected from among the first to n-th unit A/D converters according to an externally inputted control signal which responds to a conversion frequency of the A/D converter, whereby the number of unit A/D converters to be operated is set.

2. An A/D converter as defined in claim 1 wherein
   each of the first to n-th unit A/D converters has a sample/hold circuit which performs sampling of the analog input signal, in a stage prior to the first conversion stage in each unit A/D converter; and
   unit A/D converters are selected from among the first to n-th unit A/D converters according to an externally inputted control signal which responds to the conversion frequency of the A/D converter, whereby the number of unit A/D converters to be operated is set.

3. An A/D converter as defined in claim 2 wherein at least two unit A/D converters among the first to n-th unit A/D converters share operational amplifiers which perform operational amplifications for the sample/hold circuit and the conversion stage of either of adjacent two unit A/D converters for each half clock period, said operational amplifiers being provided between the sample/hold circuits and the conversion stages of the adjacent two unit A/D converters, respectively; and
   unit A/D converters are selected from among the first to n-th unit A/D converters according to a control signal which responds to the conversion frequency of the A/D converter, whereby the number of plural unit A/D converters for performing parallel processings is set.

4. An A/D converter as defined in claim 1 wherein at least two unit A/D converters among the first to n-th unit A/D converters share an operational amplifier which performs operational amplification for the conversion stage of either of adjacent two unit A/D converters for each half clock period, said operational amplifier being placed between the conversion stages of the adjacent two unit A/D converters; and
   unit A/D converters are selected from among the first to n-th unit A/D converters according to a control signal which responds to the conversion frequency of the A/D converter, whereby the number of plural unit A/D converters for performing parallel processings is set.

5. An A/D converter as defined in claim 1 including: a control circuit which outputs a control signal which responds to an externally inputted frequency selection signal that determines an output clock frequency of a PLL circuit, to each of the first to n-th unit A/D converters; and
   said PLL circuit which receives the externally inputted frequency selection signal, and outputs a conversion clock of the A/D converter to each of the first to n-th unit A/D converters;
   wherein a plurality of unit A/D converters for performing parallel processings are selected from among the first to n-th unit A/D converters according to a control signal which responds to the frequency selection signal.

6. An A/D converter as defined in claim 1 including: a detection circuit which detects the conversion frequency of the A/D converter; and
   said detection circuit determining a plurality of unit A/D converters for performing parallel processings from among the first to n-th unit A/D converters according to a control signal which responds to the conversion frequency of the A/D converter.

7. An A/D converter for converting an analog input signal into a digital output signal by using first and second unit A/D converters which time-divisionally perform parallel processings, wherein
   said first unit A/D converter has cascade-connected first to m-th (m: integer not less than 2) conversion stages for the first unit A/D converter;
   said second unit A/D converter has cascade-connected first to m-th (m: integer not less than 2) conversion stages for the second unit A/D converter;
   the respective conversion stages of the first and second unit A/D converters share an operational amplifier which performs operational amplification for either of the conversion stages of the first and second unit A/D converters for each half clock period; and
   a unit A/D converter is selected from the first and second unit A/D converters according to an externally inputted control signal which responds to a conversion frequency of the A/D converter, whereby the number of unit A/D converters to be operated is set.

8. An A/D converter as defined in claim 7 wherein
   each of the first and second unit A/D converters has a sample/hold circuit which performs sampling of the analog input signal, in a stage prior to the first conversion stage;

the sample/hold circuits in the first and second unit A/D converters share an operational amplifier which performs operational amplification for each of the sample/hold circuits for each half clock period between the sample/hold circuits; and a unit A/D converter is selected from the first and second unit A/D converters according to an externally inputted control signal which responds to the conversion frequency of the A/D converter, whereby the number of unit A/D converters to be operated is set.

9. An A/D converter as defined in claim 8 wherein each of the conversion stages of the adjacent two unit A/D converters has a first capacitor, and plural switch circuits which are operably connected to a reference voltage that is obtained by A/D converting the inputted analog signal by a sub A/D converter and D/A converting the A/D converted signal by a sub D/A converter;

the sample/hold circuits and the respective conversion stages in the adjacent two unit A/D converters have switches which are time-divisionally connected to the input terminal of the shared operational amplifier; and in a unit A/D converter which does not perform parallel processing, the sample/hold circuit and the respective conversion stages in either of the adjacent unit A/D converters are selected according to an externally inputted control signal which responds to the conversion frequency of the A/D converter so as to turn off the switches which are time-divisionally connected to the input terminal of the operational amplifier, and the switches in the selected sample/hold circuit and conversion stages are turned off.

10. An A/D converter as defined in claim 7 wherein each of the conversion stages in the adjacent two unit A/D converters has a first capacitor, and plural switch circuits which are operably connected to a reference voltage that is obtained by A/D converting the inputted analog signal by a sub A/D converter and D/A converting the A/D converted signal by a sub D/A converter;

each of the conversion stages in the adjacent two unit A/D converters has switches which are time-divisionally connected to an input terminal of the shared operational amplifier; and in a unit A/D converter which does not perform parallel processing, the respective conversion stages in either of the adjacent unit A/D converters are selected according to an externally inputted control signal which responds to the conversion frequency of the A/D converter so as to turn off the switches which are time-divisionally connected to the input terminal of the operational amplifier, and the switches in the selected conversion stages are turned off.

11. An A/D converter as defined in claim 7 including: a control circuit which outputs a control signal which responds to an externally inputted frequency selection signal that determines an output clock frequency of a PLL circuit, to each of the first to n-th unit A/D converters; and said PLL circuit which receives the externally inputted frequency selection signal, and outputs a conversion clock of the A/D converter to each of the first to n-th unit A/D converters;

wherein a plurality of unit A/D converters for performing parallel processings are selected from among the first to n-th unit A/D converters according to a control signal which responds to the frequency selection signal.

12. An A/D converter as defined in claim 7 including: a detection circuit which detects the conversion frequency of the A/D converter; and said detection circuit determining a plurality of unit A/D converters for performing parallel processings from among the first to n-th unit A/D converters according to a control signal which responds to the conversion frequency of the A/D converter.

13. An A/D conversion method using an A/D converter which converts an analog input signal into a digital output signal by using first to n-th (n: integer not less than 2) unit A/D converters which time-divisionally perform parallel processings, said method using an A/D converter in which each of the first to n-th unit A/D converters has cascade-connected first to m-th (m: integer not less than 2) conversion stages; and selecting unit A/D converters from among the first to n-th unit A/D converters according to an externally inputted control signal which responds to the conversion frequency of the A/D converter, whereby the number of unit A/D converters to be operated is set.

14. An A/D conversion method using an A/D converter which converts an analog input signal into a digital output signal by using first and second unit A/D converters which time-divisionally perform parallel processings, said method using an A/D converter in which said first unit A/D converter has cascade-connected first to m-th (m: integer not less than 2) conversion stages for the first unit A/D converter;

said second unit A/D converter has cascade-connected first to m-th (m: integer not less than 2) conversion stages for the second unit A/D converter; and the conversion stages of the first and second unit A/D converters share an operational amplifier which performs operational amplification for either of the conversion stages of the first and second unit A/D converters for each half clock period; and selecting a unit A/D converter from the first and second unit A/D converters according to an externally inputted control signal which responds to the conversion frequency of the A/D converter, whereby the number of unit A/D converters to be operated is set.

15. An A/D converter for converting an input analog signal into a digital signal by using at least two channels which are time-divisionally operated, and using an operational amplifier which is time-divisionally shared between the two channels, said A/D converter including:

a switch connected to an input terminal of the operational amplifier;

switches which are provided between a capacitor that is connected to an end of said switch on the side opposite to the input terminal to the operational amplifier and a reference voltage that is obtained by A/D converting the input analog signal by a sub A/D converter and D/A converting the A/D converted signal by a sub D/A converter;

a control circuit which outputs a control signal which responds to an externally inputted frequency selection signal that determines an output clock frequency of a PLL circuit, to each of the first to n-th unit A/D converters; and said PLL circuit which receives the externally inputted frequency selection signal, and outputs a conversion clock of the A/D converter to each of the first to n-th unit A/D converters;

wherein a plurality of unit A/D converters for performing parallel processings are selected from among the first to n-th unit A/D converters according to a control signal which responds to the frequency selection signal.

16. An A/D converter for converting an input analog signal into a digital signal by using at least two channels which are time-divisionally operated, and using an operational amplifier which is time-divisionally shared between the two channels, said A/D converter including:

a switch connected to an input terminal of the operational amplifier;

switches which are provided between a capacitor that is connected to an end of said switch on the side opposite to the input terminal to the operational amplifier and a reference voltage that is obtained by A/D converting the input analog signal by a sub A/D converter and D/A converting the A/D converted signal by a sub D/A converter; and a detection circuit which detects the conversion frequency of the A/D converter; and said detection circuit determining a plurality of unit A/D converters for performing parallel processings from among the first to n-th unit A/D converters according to a control signal which responds to the conversion frequency of the A/D converter.

* * * * *